US012707985B2

(12) United States Patent
Fan et al.

(10) Patent No.: US 12,707,985 B2
(45) Date of Patent: Aug. 11, 2026

(54) SEMICONDUCTOR STRUCTURE, DICING METHOD THEREOF, AND MEMORY

(71) Applicant: YANGTZE MEMORY TECHNOLOGIES CO., LTD., Wuhan (CN)

(72) Inventors: Dongyu Fan, Wuhan (CN); Tingting Gao, Wuhan (CN); Wei Xie, Wuhan (CN); Zhong Lv, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 326 days.

(21) Appl. No.: 18/381,030

(22) Filed: Oct. 17, 2023

(65) Prior Publication Data

US 2024/0379578 A1 Nov. 14, 2024

Related U.S. Application Data

(63) Continuation of application No. PCT/CN2023/093931, filed on May 12, 2023.

(51) Int. Cl.
*H10W 46/00* (2026.01)
*H10B 80/00* (2023.01)
(Continued)

(52) U.S. Cl.
CPC ............ *H10W 46/00* (2026.01); *H10B 80/00* (2023.02); *H10P 34/42* (2026.01); *H10P 54/00* (2026.01);
(Continued)

(58) Field of Classification Search
CPC ..... H01L 23/544; H01L 21/268; H01L 21/78; H01L 25/0657; H01L 25/18; H01L 25/50;
(Continued)

(56) References Cited

U.S. PATENT DOCUMENTS 6,528,393 B2 * 3/2003 Tao ........................ H01L 21/78 257/E29.022
6,747,337 B1 * 6/2004 Yamamoto ........... H01L 23/544 257/E23.179
(Continued)

FOREIGN PATENT DOCUMENTS

CN 111223949 A 6/2020
CN 111710646 A 9/2020
(Continued)

OTHER PUBLICATIONS

Extended European Search Report issued in corresponding European Application No. 23923196.2, mailed Sep. 23, 2025, 8 pages.
(Continued)

*Primary Examiner* — Vu A Vu
(74) *Attorney, Agent, or Firm* — BAYES PLLC

(57) ABSTRACT

According to one aspect of the present disclosure, a semiconductor structure is provided. The semiconductor structure may include a first wafer. The first wafer may include a plurality of first peripheral circuit chips, a first dicing lane between the first peripheral circuit chips, and a first mark at an edge of the first wafer. A pointing direction of the first mark may be the same as an extending direction of the first dicing lane. A cleavage plane of the first wafer may be parallel to the pointing direction of the first mark. The pointing direction of the first mark may be an extending direction of a line of symmetry of the first wafer. The semiconductor structure may include a second wafer. The
(Continued)

second wafer and the first wafer may be disposed in a stack. The second wafer may be a plurality of memory array chips.

20 Claims, 6 Drawing Sheets

(51) Int. Cl.
*H10P 34/42* (2026.01)
*H10P 54/00* (2026.01)
*H10W 90/00* (2026.01)

(52) U.S. Cl.
CPC .......... *H10W 90/00* (2026.01); *H10W 46/503* (2026.01)

(58) Field of Classification Search
CPC .......... H01L 2223/5446; H01L 21/304; H10B 80/00
USPC .......................................................... 257/620
See application file for complete search history.

(56) References Cited

U.S. PATENT DOCUMENTS 9,029,234 B2 * 5/2015 Safran ..................... H01L 24/81 438/455
10,424,512 B2 * 9/2019 Tanaka .................. H01L 21/681
10,734,285 B2 * 8/2020 Li ........................... H01L 24/03
11,682,652 B2 * 6/2023 Li ..................... H01L 21/02164 438/107
11,832,520 B2 * 11/2023 Chen ................... C23C 16/4588
12,383,982 B2 * 8/2025 Chen ................... H01L 21/6835
2019/0371765 A1 12/2019 Haba et al.
2020/0251374 A1 8/2020 Makala et al.
2020/0273807 A1 * 8/2020 Won .................... H01L 21/6835
2022/0293556 A1 9/2022 Li et al.
2022/0301934 A1 * 9/2022 Nakamura .............. H01L 21/78
2025/0105011 A1 * 3/2025 Sakamoto ............... H01L 21/78

FOREIGN PATENT DOCUMENTS

CN 113169125 A 7/2021
JP 2004260083 A 9/2004
JP 2016134427 A 7/2016
JP 6455166 B2 1/2019
KR 20200001965 A 1/2020
KR 20210110855 A 9/2021

OTHER PUBLICATIONS

Wei-Sheng Lei, Ajay Kumar, and Rao Yalamanchili, Die singulation technologies for advanced packaging: A critical review, Review Article, Aug. 2012, https://www.researchgate.net/figure/Cleavage-planes-f110g-of-100-plane-GaAs-and-Si-wafers-Note-that-the-scribe-lines-are_fig23_235332900.

* cited by examiner

SEMICONDUCTOR STRUCTURE, DICING METHOD THEREOF, AND MEMORY

CROSS-REFERENCE TO RELATED APPLICATIONS

This application is a continuation of International Application No. PCT/CN2023/093931, filed on May 12, 2023, which is incorporated herein by reference in its entirety.

TECHNICAL FIELD

The present disclosure relates to, but is not limited to, a semiconductor structure and a dicing method thereof, and a memory.

BACKGROUND

In a semiconductor manufacturing process, a plurality of chips may be formed on a semiconductor substrate through semiconductor processes. Then, the semiconductor structure may be diced into individual separated chips through a dicing process. These chips may be packaged. In this way, usable semiconductor devices may be obtained.

SUMMARY

According to a first aspect of the present disclosure, a semiconductor structure is provided. The semiconductor structure may include a first wafer. The first wafer may include a plurality of first peripheral circuit chips, a first dicing lane between the first peripheral circuit chips, and a first mark at an edge of the first wafer. A pointing direction of the first mark may be the same as an extending direction of the first dicing lane. A cleavage plane of the first wafer may be parallel to the pointing direction of the first mark. The pointing direction of the first mark may be an extending direction of a line of symmetry of the first wafer. The semiconductor structure may include a second wafer. The second wafer and the first wafer may be disposed in a stack. The second wafer may be a plurality of memory array chips.

In some implementations, the semiconductor structure may be a third wafer. In some implementations, the third wafer may include a plurality of second peripheral circuit chips. In some implementations, a second dicing lane between the second peripheral circuit chips, and a second mark at an edge of the third wafer, and an extending direction of the second dicing lane may be the same as the extending direction of the first dicing lane.

In some implementations, an included angle between a pointing direction of the second mark and the extending direction of the second dicing lane may be a, where 0°<a<90°. In some implementations, characteristic sizes of devices in the second peripheral circuit chips may be smaller than characteristic sizes of devices in the first peripheral circuit chips. In some implementations, the pointing direction of the second mark may be an extending direction of a line of symmetry of the third wafer.

In some implementations, the pointing direction of the second mark may be the same as the extending direction of the second dicing lane. In some implementations, a cleavage plane of the third wafer may be parallel to the pointing direction of the second mark. In some implementations, the characteristic sizes of the devices in the first peripheral circuit chips may be the same as the characteristic sizes of the devices in the second peripheral circuit chips. In some implementations, the pointing direction of the second mark may be the extending direction of the line of symmetry of the third wafer.

In some implementations, the third wafer may be located between the first wafer and the second wafer.

In some implementations, the second wafer may be located between the first wafer and the third wafer.

In some implementations, the memory array chips may be three-dimensional NAND memory array chips.

According to a second aspect of the present disclosure, a method of dicing a semiconductor structure is provided. The method may include providing a semiconductor structure to be diced. The semiconductor structure to be diced may include a first wafer and a second wafer. The first wafer may include a plurality of first peripheral circuit chips, a first dicing lane between the first peripheral circuit chips, and a first mark at an edge of the first wafer. A pointing direction of the first mark may be the same as an extending direction of the first dicing lane. A cleavage plane of the first wafer may be parallel to the pointing direction of the first mark. The second wafer and the first wafer may be disposed in a stack. The second wafer may include a plurality of memory array chips. The pointing direction of the first mark may be an extending direction of a line of symmetry of the first wafer. The method may include dicing the first dicing lane from a side of the first wafer away from the second wafer. The method may include stretching the semiconductor structure to be diced, such that the cleavage plane of the first wafer extends to the second wafer.

In some implementations, the dicing the first dicing lane of the first wafer from the side of the first wafer away from the second wafer may include dicing the first dicing lane of the first wafer from the side of the first wafer away from the second wafer by using a laser dicing process.

In some implementations, the semiconductor structure may include a third wafer. In some implementations, the third wafer may include a plurality of second peripheral circuit chips, a second dicing lane between the second peripheral circuit chips, and a second mark at an edge of the third wafer. In some implementations, an extending direction of the second dicing lane may be the same as the extending direction of the first dicing lane.

In some implementations, an included angle between a pointing direction of the second mark and the extending direction of the second dicing lane may be a, where 0°<a<90°. In some implementations, characteristic sizes of devices in the second peripheral circuit chips may be smaller than characteristic sizes of devices in the first peripheral circuit chips. In some implementations, the pointing direction of the second mark may be an extending direction of a line of symmetry of the third wafer. In some implementations, the stretching the semiconductor structure to be diced such that the cleavage plane of the first wafer extends to the second wafer may include stretching the semiconductor structure to be diced such that the cleavage plane of the first wafer extends to the second wafer and the third wafer.

In some implementations, a pointing direction of the second mark may be the same as the extending direction of the second dicing lane, a cleavage plane of the third wafer may be parallel to the pointing direction of the second mark, and characteristic sizes of devices in the first peripheral circuit chips may be the same as characteristic sizes of devices in the second peripheral circuit chips. In some implementations, the pointing direction of the second mark may be an extending direction of a line of symmetry of the third wafer. In some implementations, the second wafer may be located between the first wafer and the third wafer. In some implementations, the method may further include dicing the second dicing lane from a side of the third wafer away from the second wafer while dicing the first dicing lane from the side of the first wafer away from the second wafer. In some implementations, the stretching the semiconductor structure to be diced such that the cleavage plane of the first wafer extends to the second wafer may further include stretching the semiconductor structure to be diced such that the cleavage plane of the first wafer and the cleavage plane of the third wafer extend to the second wafer.

In some implementations, a pointing direction of the second mark may be the same as the extending direction of the second dicing lane, a cleavage plane of the third wafer may be parallel to the pointing direction of the second mark, and characteristic sizes of devices in the first peripheral circuit chips may be the same as characteristic sizes of devices in the second peripheral circuit chips. In some implementations, the pointing direction of the second mark may be an extending direction of a line of symmetry of the third wafer. In some implementations, the third wafer may be located between the first wafer and the second wafer. In some implementations, the dicing the first dicing lane from the side of the first wafer away from the second wafer may include dicing the first dicing lane and the second dicing lane from the side of the first wafer away from the second wafer. In some implementations, stretching the semiconductor structure to be diced such that the cleavage plane of the first wafer extends to the second wafer may include stretching the semiconductor structure to be diced, such that the cleavage plane of the first wafer and the cleavage plane of the third wafer extend to the second wafer.

In some implementations, the stretching the semiconductor structure to be diced may include stretching the semiconductor structure to be diced along a direction perpendicular to the cleavage plane of the first wafer.

In some implementations, the providing the semiconductor structure to be diced may include providing the first wafer comprising the plurality of first peripheral circuit chips. In some implementations, the providing the semiconductor structure to be diced may include providing the second wafer comprising the plurality of memory array chips. In some implementations, the providing the semiconductor structure to be diced may include bonding the first wafer to the second wafer to form the semiconductor structure to be diced.

According to a third aspect of the present disclosure, a method of forming a memory is provided. The method may include providing a semiconductor structure to be diced. The semiconductor structure to be diced may include a first wafer and a second wafer. The first wafer may include a plurality of first peripheral circuit chips, a first dicing lane between the first peripheral circuit chips, and a first mark at an edge of the first wafer. A pointing direction of the first mark may be the same as an extending direction of the first dicing lane. A cleavage plane of the first wafer may be parallel to the pointing direction of the first mark. The second wafer and the first wafer may be disposed in a stack. The second wafer may include a plurality of memory array chips. The pointing direction of the first mark may be an extending direction of a line of symmetry of the first wafer. The method may include dicing the first dicing lane from a side of the first wafer away from the second wafer. The method may include stretching the semiconductor structure to be diced, such that the cleavage plane of the first wafer extends to the second wafer.

In some implementations, the dicing the first dicing lane of the first wafer from the side of the first wafer away from the second wafer may include dicing the first dicing lane of the first wafer from the side of the first wafer away from the second wafer by using a laser dicing process.

In some implementations, the semiconductor structure may include a third wafer. In some implementations, the third wafer may include a plurality of second peripheral circuit chips, a second dicing lane between the second peripheral circuit chips, and a second mark at an edge of the third wafer. In some implementations, an extending direction of the second dicing lane may be the same as the extending direction of the first dicing lane.

In some implementations, an included angle between a pointing direction of the second mark and the extending direction of the second dicing lane may be a, where $0° < a < 90°$. In some implementations, characteristic sizes of devices in the second peripheral circuit chips may be smaller than characteristic sizes of devices in the first peripheral circuit chips. In some implementations, the pointing direction of the second mark may be an extending direction of a line of symmetry of the third wafer. In some implementations, the stretching the semiconductor structure to be diced such that the cleavage plane of the first wafer extends to the second wafer may include stretching the semiconductor structure to be diced such that the cleavage plane of the first wafer extends to the second wafer and the third wafer.

In some implementations, a pointing direction of the second mark may be the same as the extending direction of the second dicing lane, a cleavage plane of the third wafer may be parallel to the pointing direction of the second mark, and characteristic sizes of devices in the first peripheral circuit chips may be the same as characteristic sizes of devices in the second peripheral circuit chips. In some implementations, the pointing direction of the second mark may be an extending direction of a line of symmetry of the third wafer. In some implementations, the second wafer may be located between the first wafer and the third wafer. In some implementations, the method may further include dicing the second dicing lane from a side of the third wafer away from the second wafer while dicing the first dicing lane from the side of the first wafer away from the second wafer. In some implementations, the stretching the semiconductor structure to be diced such that the cleavage plane of the first wafer extends to the second wafer may further include stretching the semiconductor structure to be diced such that the cleavage plane of the first wafer and the cleavage plane of the third wafer extend to the second wafer.

In some implementations, a pointing direction of the second mark may be the same as the extending direction of the second dicing lane, a cleavage plane of the third wafer may be parallel to the pointing direction of the second mark, and characteristic sizes of devices in the first peripheral circuit chips may be the same as characteristic sizes of devices in the second peripheral circuit chips. In some implementations, the pointing direction of the second mark may be an extending direction of a line of symmetry of the third wafer. In some implementations, the third wafer may be located between the first wafer and the second wafer. In some implementations, the dicing the first dicing lane from the side of the first wafer away from the second wafer may include dicing the first dicing lane and the second dicing lane from the side of the first wafer away from the second wafer. In some implementations, stretching the semiconductor structure to be diced such that the cleavage plane of the first wafer extends to the second wafer may include stretching the semiconductor structure to be diced, such that the cleavage plane of the first wafer and the cleavage plane of the third wafer extend to the second wafer.

DETAILED DESCRIPTION

Figure 1:
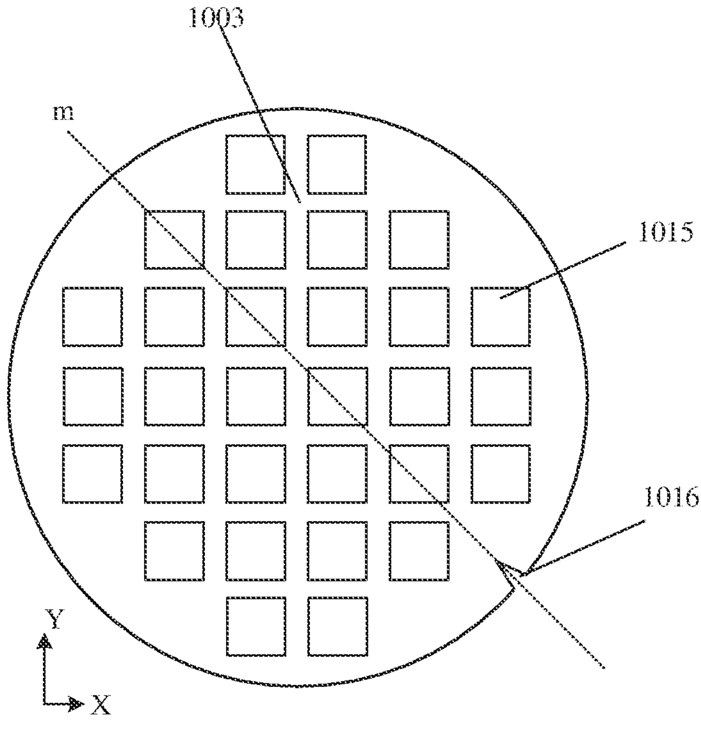
FIG. 1 is a top schematic view of a wafer of an example of the present disclosure.

Implementations disclosed by the present disclosure will be described below in more detail with reference to the drawings. Although the implementations of the present disclosure are shown in the drawings, it is to be understood that the present disclosure may be achieved by various forms, which should not be limited by the specific implementations as set forth herein. Rather, these implementations are provided in order to understand the present disclosure more thoroughly, and can fully convey the scope disclosed by the present disclosure to those skilled in the art.

In the description below, various details are presented to provide a more thorough understanding of the present disclosure. However, it is apparent to those skilled in the art that the present disclosure may be carried out without one or more of these details. In other examples, in order to avoid confusion with the present disclosure, some technical features well-known in the art are not described. That is, not all features of actual examples are described herein, and well-known functions and structures are not described in detail.

In the drawings, for the purpose of clarity, sizes and relative sizes of layers, areas and elements may be exaggerated. The same reference numerals in different figures may denote like elements throughout.

It should be understood that when an element or a layer is referred to as being "on", "adjacent to", "connected to", or "coupled to" other elements or layers, it may be directly on, adjacent to, connected to, or coupled to the other elements or layers, or one or more intervening elements or layers may be present. In contrast, when an element is referred to as being "directly on", "immediately adjacent to", "directly connected to", or "directly coupled to" other elements or layers, no intervening elements or layers are present. It should be understood that, although the terms first, second, third, etc., may be used to describe various elements, components, areas, layers and/or portions, these elements, components, areas, layers and/or portions should not be limited by these terms. These terms are only used to distinguish one element, component, area, layer or portion from another element, component, area, layer or portion. Thus, a first element, component, area, layer or portion discussed below may be represented as a second element, component, area, layer or portion, without departing from the teachings of the present disclosure. When the second element, component, area, layer or portion is discussed, it does not mean that the first element, component, area, layer or portion is necessarily present in the present disclosure.

The spatially relative terms, such as "beneath", "below", "lower", "under", "over", "upper", and the like, may be used herein for ease of description to describe a relationship between one element or feature and other elements or features as illustrated in the figures. It should be understood that, the spatial relative terms are intended to further encompass different orientations of a device in use or operation in addition to the orientation depicted in the figures. For example, if a device in the drawings is turned over, then an element or a feature described as "below other elements", or "under other elements", or "beneath other elements" will be orientated to be "above" the other elements or features. Thus, the terms, "below" and "beneath", may include both upper and lower orientations. The device may be orientated otherwise (rotated by 90 degrees or other orientations), and the spatial descriptive terms used herein are interpreted accordingly.

The terms used herein are only intended to describe the specific examples, and are not used as limitations of the present disclosure. As used herein, unless otherwise indicated expressly in the context, "a", "an", and "the" in a singular form are also intended to include a plural form. It should also be understood that the terms "consist of" and/or "comprise", when used in this specification, determine the presence of the feature, integer, step, operation, element and/or component, but do not preclude the presence or addition of one or more of other features, integers, steps, operations, elements, components, and/or groups. As used herein, the term "and/or" includes any and all combinations of the listed relevant items.

In order to have a more detailed understanding of the features and the technical contents of the examples of the present disclosure, the implementation of the examples of the present disclosure is set forth in detail below in conjunction with the drawings, and the appended drawings are only used for reference and illustration, instead of being used to limit the examples of the present disclosure.

With rapid development of the electronic industry, there is an increasing need for high-performance and low-cost semiconductor devices. An integration level of a traditional two-dimensional or planar memory is mainly determined by area occupied by a unit memory cell. Therefore, the integration level of the traditional two-dimensional memory is affected by a fine pattern formation technology to a great extent. However, in order to improve the pattern fineness, expensive process apparatuses are needed, which limits the increase of the integration level of the two-dimensional memory. A three-dimensional memory device is an emerging type of flash memory as developed by the industry. The three-dimensional memory device solves the problem of limitations brought about by a two-dimensional or planar flash memory by stacking multiple layers of data storage cells vertically. The three-dimensional memory device has excellent precision, supports a higher storage capacity accommodated in a smaller space, is low in cost and power consumption, and can fully meet numerous use cases.

As the requirements for the performance of the three-dimensional memory are increase, a peripheral circuit and a memory array of the three-dimensional memory may be bonded after being formed in different wafers. When a semiconductor structure after bonding is diced, the wafer formed with the peripheral circuit is generally selected as a wafer to be diced. As shown in FIG. 1, in some examples, a plurality of peripheral circuit chips 1015 are formed in the wafer to be diced. A first dicing lane 1003 extending along a Y-axis direction is disposed between the plurality of peripheral circuit chips 1015. A mark 1016 is disposed at an edge of the wafer. There is a certain included angle between a pointing direction of the mark 1016 and an extending direction of the first dicing lane 1003. The pointing direction of the mark 1016 is an extending direction of a line of symmetry m of the wafer. Cleavage of the wafer is in a direction of the internal structure of the wafer where the connection strength is weak. Under an external force, a fracture easily occurs along a direction of a cleavage plane, and a smooth plane can be formed by the fracture. The cleavage plane of the wafer is parallel to the pointing direction of the mark 1016 (e.g., the extending direction of the line of symmetry m). When there is a certain included angle between the extending direction of the line of symmetry m and the extending direction of the first dicing lane 1003, there is a certain included angle between the cleavage plane of the wafer and the extending direction of the first dicing lane 1003. Thus, the cleavage plane of the wafer (e.g., in a position where the line of symmetry m is located) passes through interiors of the peripheral circuit chips 1015, such that the wafer is prone to cleave along the cleavage plane (e.g., the interiors of the peripheral circuit chips) in a stretching process during dicing, thereby affecting the yield of the chips and having a detrimental impact on the throughput of the chips.

Figure 2:
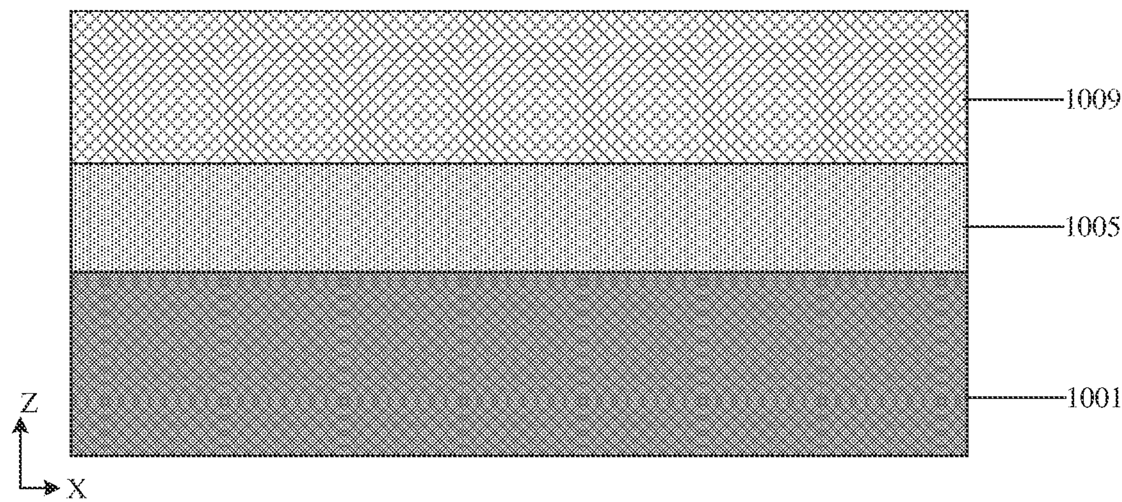
FIG. 2 is a schematic view I of a semiconductor structure of an example of the present disclosure.
Figure 3:
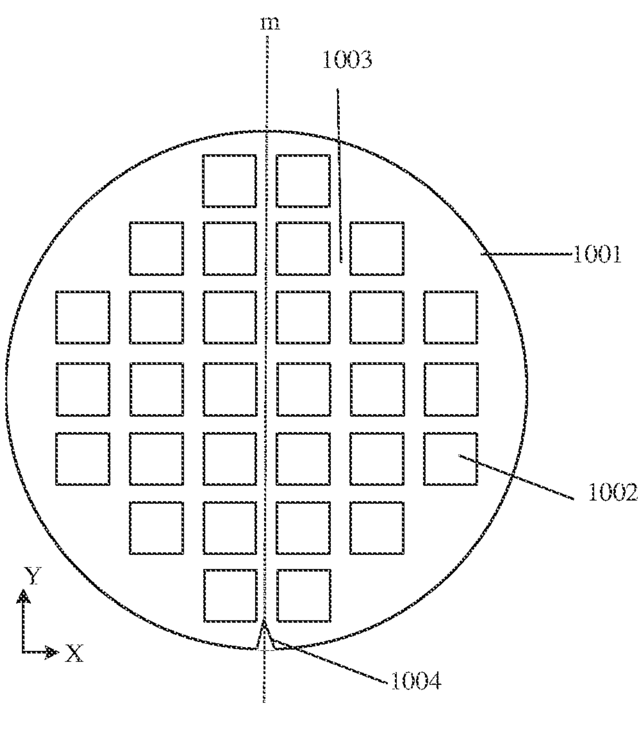
FIG. 3 is a top schematic view I of a first wafer of an example of the present disclosure.
Figure 5:
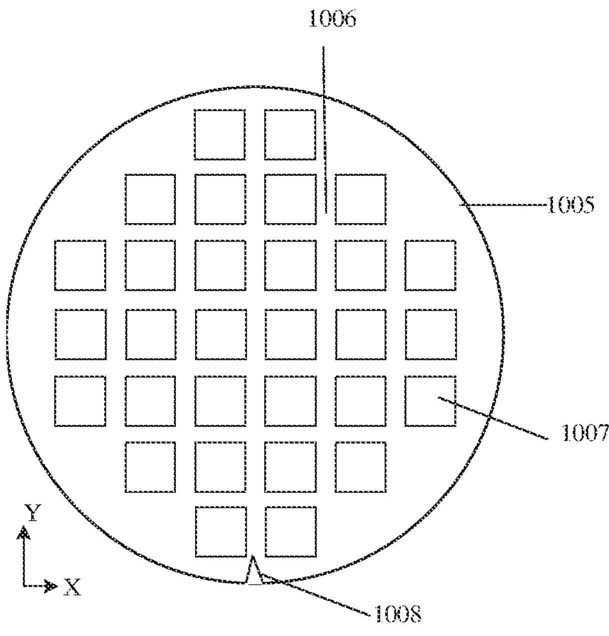
FIG. 5 is a top schematic view of a second wafer of an example of the present disclosure.

To overcome these and other challenges, examples of the present disclosure provide an exemplary semiconductor structure. FIG. 2 is a schematic view of a semiconductor structure provided by examples of the present disclosure. FIG. 3 is a top schematic view of a first wafer 1001 provided by examples of the present disclosure. FIG. 5 is a top schematic view of a second wafer 1005 provided by examples of the present disclosure. As shown in FIGS. 2, 3 and 5, the semiconductor structure may include, e.g., a first wafer 1001. The first wafer 1001 may include a plurality of first peripheral circuit chips 1002, a first dicing lane 1003 between the first peripheral circuit chips 1002, and a first mark 1004 at an edge of the first wafer 1001. A pointing direction of the first mark 1004 may be the same as an extending direction of the first dicing lane 1003. A cleavage plane of the first wafer 1001 may be parallel to the pointing direction of the first mark 1004. The pointing direction of the first mark 1004 may be an extending direction of a line of symmetry of the first wafer 1001. The semiconductor structure shown in FIGS. 2, 3, and 5 may include a second wafer 1005. The second wafer 1005 and the first wafer 1001 may be disposed in a stack; and the second wafer 1005 may include a plurality of memory array chips 1007.

Figure 4:
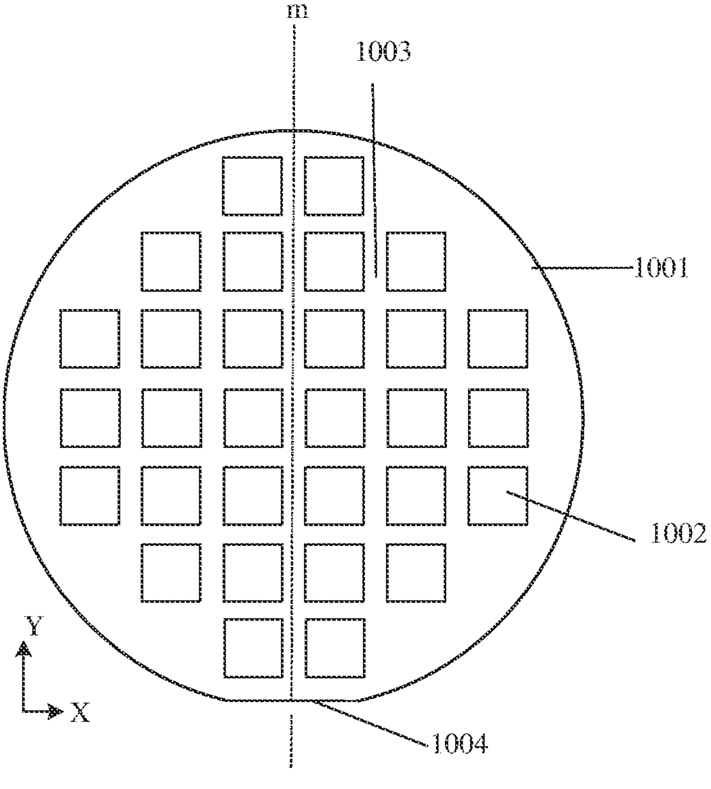
FIG. 4 is a top schematic view II of a first wafer of an example of the present disclosure.

Here, the mark of the wafer generally includes two types: a notch mark and a flat mark. FIG. 3 shows a schematic view marked with a notch mark, and FIG. 4 shows a schematic view marked with a flat mark. As shown in FIGS. 3 and 4, the extending direction of the first dicing lane 1003 may be, for example, a Y-axis direction as shown in FIGS. 3 and 4. The pointing direction of the first mark 1004 may be the extending direction of the line of symmetry m of the first wafer 1001. The extending direction of the line of symmetry m of the first wafer 1001 and the extending direction of the first dicing lane 1003 may be the same and both are the Y-axis direction, while the cleavage plane of the first wafer 1001 may be parallel to the pointing direction of the first mark 1004. Thus, the cleavage plane of the first wafer 1001 may be parallel to the extending direction of the first dicing lane 1003.

It may be understood that, in the examples of the present disclosure, the cleavage plane of the first wafer 1001 may be parallel to the extending direction of the first dicing lane 1003 of the first wafer 1001, such that dicing may be performed from the side of the first wafer 1001 of the semiconductor structure during subsequent dicing of the dicing lane of the semiconductor structure, and the first wafer 1001 may be more prone to cleave along the first dicing lane. This may reduce or eliminate the problem of the first peripheral circuit chips 1002 cleaving along the interiors of the chips so that the chip yield is affected due to the cleavage plane of the wafer passing through the first peripheral circuit chips 1002.

In some examples, the first wafer 1001, the second wafer 1005, and a third wafer in the following description may be, for example, wafers that have finished a process of a wafer stage (e.g., a stage of forming a device structure and an interconnection structure of the device structure).

Here, the first wafer 1001 may include the plurality of first peripheral circuit chips 1002. Each of the first peripheral circuit chips 1002 may include a semiconductor substrate and a peripheral device structure on the semiconductor substrate. The peripheral device structure may include a MOS device or other semiconductor devices. The semiconductor substrate may include silicon (e.g., monocrystalline silicon (c-Si), silicon germanium (SiGe), gallium arsenide (GaAs), germanium (Ge), silicon on insulator (SOI), or any other suitable materials).

In some examples, diameters of the first wafer 1001, the second wafer 1005, and the third wafer in the following description may be 150 mm, 200 mm, 300 mm, and 450 mm, etc., but the present disclosure is not limited thereto.

In some examples, the memory array chips 1007 may include three-dimensional NAND memory array chips, but the present disclosure is not limited thereto.

In some examples, the memory array chips 1007 may also include three-dimensional NOR memory array chips, dynamic random access memory array chips, ferroelectric memory array chips, phase change memory array chips, etc., but the present disclosure is not limited thereto.

In some examples, the first wafer 1001 may be bonded to the second wafer 1005 through a bonding process such that the first peripheral circuit chips 1002 in the first wafer 1001 are electrically connected with the memory array chips 1007 in the second wafer 1005.

In some examples, as shown in FIG. 5, there may be a third dicing lane 1006 between the plurality of memory array chips 1007 of the second wafer 1005. Here, an extending direction of the third dicing lane 1006 and the extending direction of the first dicing lane 1003 may be the same and both are the Y-axis direction. In other words, the memory array chips 1007 and the first peripheral circuit chips 1002 may be separated along the same direction after dicing the semiconductor structure. The second wafer 1005 may further include a third mark 1008 at an edge of the second wafer 1005. A pointing direction of the third mark 1008 may be the same as the extending direction of the third dicing lane 1006, and there may be also a certain included angle between the pointing direction of the third mark 1008 and the extending direction of the third dicing lane 1006.

Figure 6:
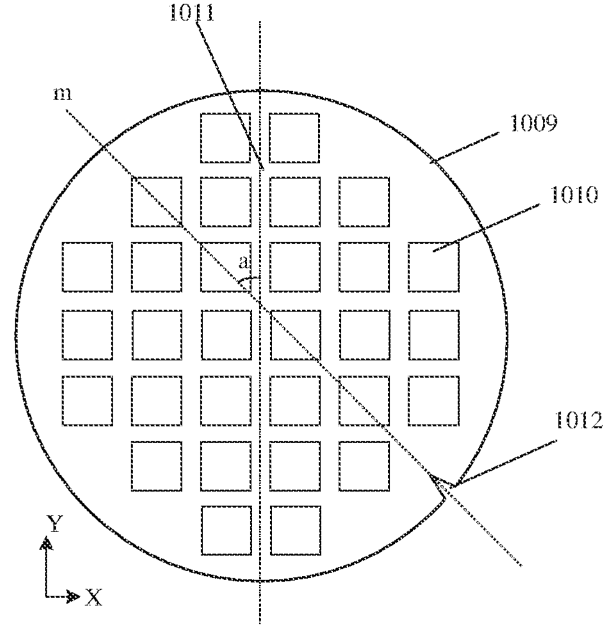
FIG. 6 is a top schematic view I of a third wafer of an example of the present disclosure.

In some examples, as shown in FIGS. 2 and 6, the semiconductor structure may further include the third wafer 1009. The third wafer 1009 may include a plurality of second peripheral circuit chips 1010, a second dicing lane

1011 between the second peripheral circuit chips 1010, and a second mark 1012 at an edge of the third wafer 1009. Here, an extending direction of the second dicing lane 1011 and the extending direction of the first dicing lane 1003 are the same and both are the Y-axis direction.

In some examples, as shown in FIG. 6, an included angle between a pointing direction of the second mark 1012 and the extending direction of the second dicing lane 1011 may be a, where a is in the range of 0°<a<90°. Characteristic sizes of devices in the second peripheral circuit chips 1010 may be smaller than characteristic sizes of devices in the first peripheral circuit chips 1002. The pointing direction of the second mark 1012 may be an extending direction of a line of symmetry of the third wafer 1009.

Here, the characteristic size may refer to a minimum size of a semiconductor device in the integrated circuit field. In a complementary metal oxide semiconductor process, a typical representative of the characteristic size is a width of a "gate", e.g., a channel length of a MOS device. Generally, when the characteristic size is smaller, the integration level of the chip may be higher, the performance may be better, and the power consumption may be lower.

It may be understood that, when the included angle between the pointing direction of the second mark 1012 and the extending direction of the second dicing lane 1011 is a, where a is in the range of 0°<a<90°, hole mobility of the devices formed on the third wafer 1009 may be higher. This may be more suitable for forming peripheral circuit devices with smaller characteristic sizes and higher performance.

In examples of the present disclosure, the semiconductor structure formed in hybrid wafer stacks for dicing is formed, and the peripheral circuits are formed in two wafers. A part of devices with larger characteristic sizes may be formed in the first wafer 1001, which can act as a wafer to be diced at the same time. The other part of the devices with smaller characteristic sizes may be formed in the third wafer 1009. As such, the requirements for dicing may be met, the yield of the chips may be increased, and high-performance peripheral circuit devices may be formed, thereby improving the performance of the chips.

Figure 7:
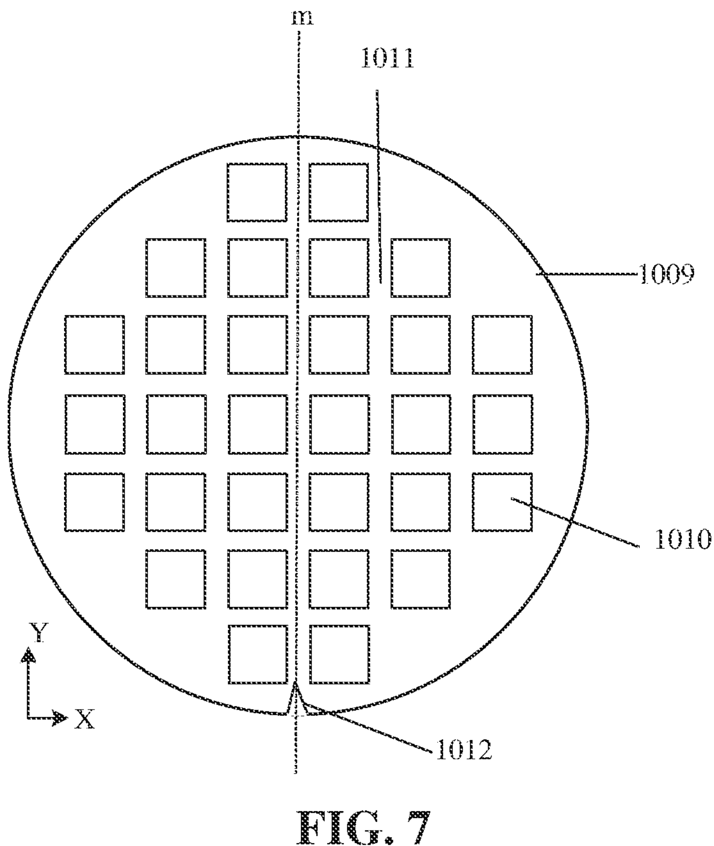
FIG. 7 is a top schematic view II of a third wafer of an example of the present disclosure.

In some examples, as shown in FIG. 7, the pointing direction of the second mark 1012 may be the same as the extending direction of the second dicing lane 1011, a cleavage plane of the third wafer 1009 may be parallel to the pointing direction of the second mark 1012, and the characteristic sizes of the devices in the first peripheral circuit chips 1002 may be the same as the characteristic sizes of the devices in the second peripheral circuit chips 1010. The pointing direction of the second mark 1012 may be is the extending direction of the line of symmetry of the third wafer 1009.

It may be understood that, when the pointing direction of the second mark 1012 is the same as the extending direction of the second dicing lane 1011, and the cleavage plane of the third wafer 1009 is parallel to the pointing direction of the second mark 1012, the characteristic sizes in the formed second peripheral circuit chips 1010 may be the same as the characteristic sizes in the first peripheral circuit chips 1002. For example, the devices with the large characteristic sizes may be formed in both the second peripheral circuit chips 1010 and the first peripheral circuit chips 1002.

In examples of the present disclosure, there are several relative position relationships of the first wafer 1001, the second wafer 1005 and the third wafer 1009.

Figure 8:
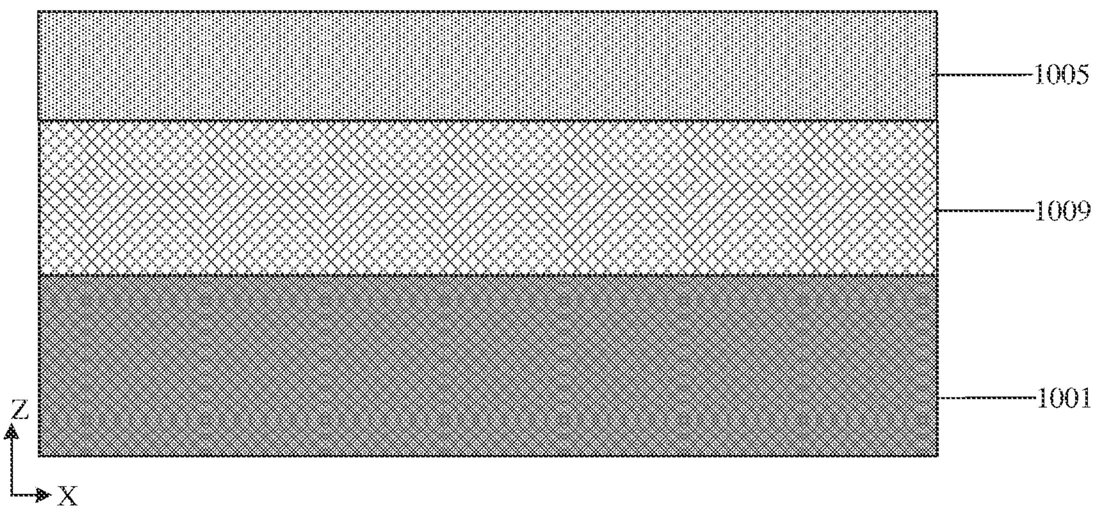
FIG. 8 is a schematic view II of a semiconductor structure of an example of the present disclosure.

In some examples, as shown in FIG. 8, the third wafer 1009 may be located between the first wafer 1001 and the second wafer 1005.

In some examples, as shown in FIG. 2, the second wafer 1005 may be located between the first wafer 1001 and the third wafer 1009.

It may be understood that, when the pointing direction of the second mark 1012 is the same as the extending direction of the second dicing lane 1011, and the cleavage plane of the third wafer 1009 is parallel to the pointing direction of the second mark 1012, the cleavage plane of the third wafer 1009 may be parallel to the extending direction of the second dicing lane 1011 of the third wafer 1009 such that the third wafer 1009 is also suitable for dicing. The second wafer 1005 may be located between the first wafer 1001 and the third wafer 1009, such that the semiconductor structure can be diced from the side of the first wafer 1001 and the side of the third wafer 1009 at the same time. In this way, the process requirements of simultaneous two-side dicing may be met to improve subsequent dicing efficiency.

Examples of the present disclosure provide a semiconductor structure that includes a first wafer 1001 and a second wafer 1005. The first wafer 1001 may include a plurality of first peripheral circuit chips 1002, a first dicing lane 1003 between the first peripheral circuit chips 1002, and a first mark 1004 at an edge of the first wafer 1001. A pointing direction of the first mark 1004 may be the same as an extending direction of the first dicing lane 1003, a cleavage plane of the first wafer 1001 may be parallel to the pointing direction of the first mark 1004, and the pointing direction of the first mark 1004 may be an extending direction of a line of symmetry of the first wafer 1001. The second wafer 1005 and the first wafer 1001 may be disposed in a stack, and the second wafer 1005 may include a plurality of memory array chips 1007.

In examples of the present disclosure, the pointing direction of the first mark 1004 may be the same as the extending direction of the first dicing lane 1003, and the cleavage plane of the first wafer 1001 may be parallel to the pointing direction of the first mark 1004 such that the cleavage plane of the first wafer 1001 is parallel to the extending direction of the first dicing lane 1003 of the first wafer 1001. As such, dicing may be performed from the side of first wafer 1001 of the semiconductor structure during subsequent dicing of the semiconductor structure, and the first wafer 1001 may be more prone to cleave along a direction of the first dicing lane. In this way, the problem that the first peripheral circuit chips 1002 cleave along the interiors of the chips may be reduced to increase the chip yield due to the fact that the cleavage plane of the wafer passes through the interiors of the first peripheral circuit chips 1002 when there is a certain included angle between the cleavage plane and the dicing lane of the wafer.

Figure 9:
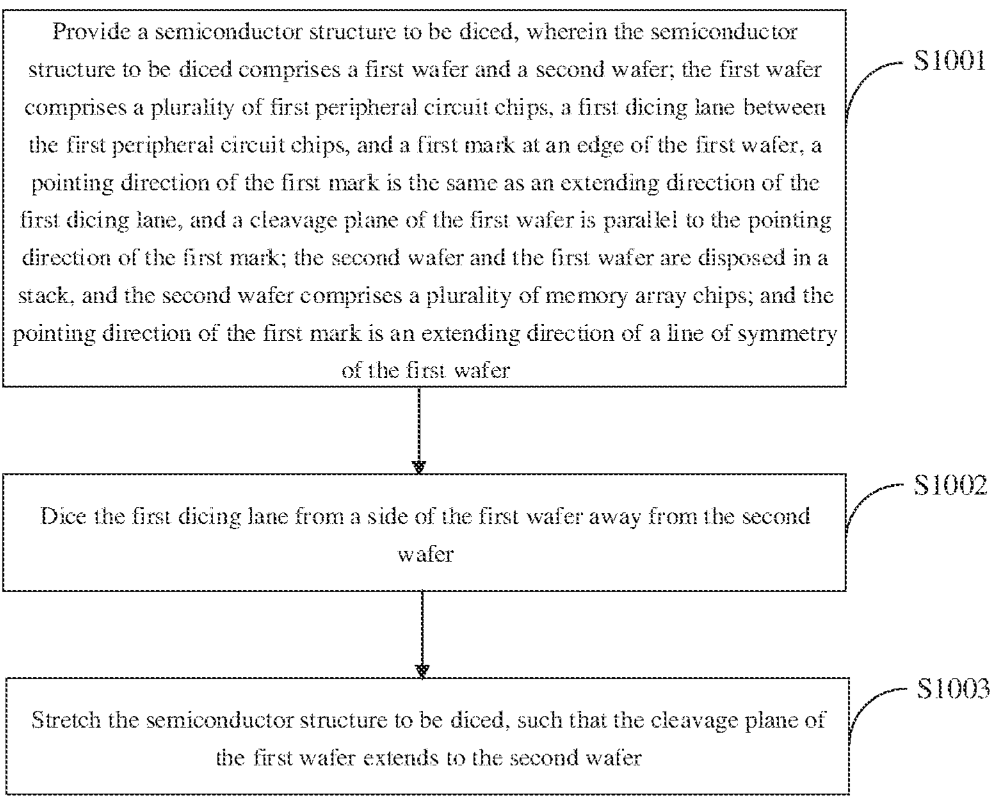
FIG. 9 is a flow diagram of process operations of a semiconductor structure of an example of the present disclosure.

Based on the above-mentioned semiconductor structure, examples of the present disclosure further provide a dicing method of a semiconductor structure. As shown in FIG. 9, the method may include operations S1001, S1002, and S1003.

For example, referring to FIG. 9, at S1001, the method may include providing a semiconductor structure to be diced. The semiconductor structure to be diced may include a first wafer 1001 and a second wafer 1005. The first wafer 1001 may include a plurality of first peripheral circuit chips, a first dicing lane between the first peripheral circuit chips, and a first mark at an edge of the first wafer 1001. A pointing direction of the first mark may be the same as an extending direction of the first dicing lane, and a cleavage plane of the first wafer 1001 may be parallel to the pointing direction of the first mark. The second wafer 1005 and the first wafer 1001 may be disposed in a stack, and the second wafer 1005 may include a plurality of memory array chips. The pointing direction of the first mark may be an extending direction of a line of symmetry of the first wafer 1001.

At S1002, the method may include dicing the first dicing lane from a side of the first wafer 1001 away from the second wafer 1005.

At S1003, the method may include stretching the semiconductor structure to be diced such that the cleavage plane of the first wafer 1001 extends to the second wafer 1005.

The dicing method of the semiconductor structure will be further introduced below in conjunction with FIGS. 10-13.

Figure 10:
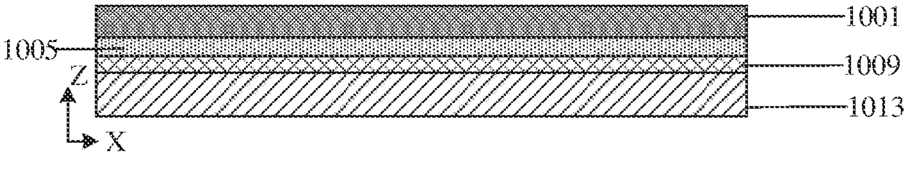
FIGS. 10-13 are schematic views of a dicing process of a semiconductor structure of an example of the present disclosure.

For example, at S1001, as shown in FIG. 10, the semiconductor structure to be diced is provided, and the semiconductor structure to be diced has been introduced in detail in the above introduction of the semiconductor structure, which is no longer repeated here. In some examples, the providing the semiconductor structure to be diced may include providing the first wafer 1001 comprising the plurality of first peripheral circuit chips. In some examples, the providing the semiconductor structure to be diced may include providing the second wafer 1005 comprising the plurality of memory array chips. In some examples, the providing the semiconductor structure to be diced may include bonding the first wafer 1001 to the second wafer 1005 to form the semiconductor structure to be diced. In some examples, after providing the semiconductor structure to be diced, the method may further include providing a carrier wafer 1013, and disposing the semiconductor structure to be diced on the carrier wafer 1013 with the first wafer 1001 in the semiconductor structure to be diced facing away from the carrier wafer 1013.

Figure 11:
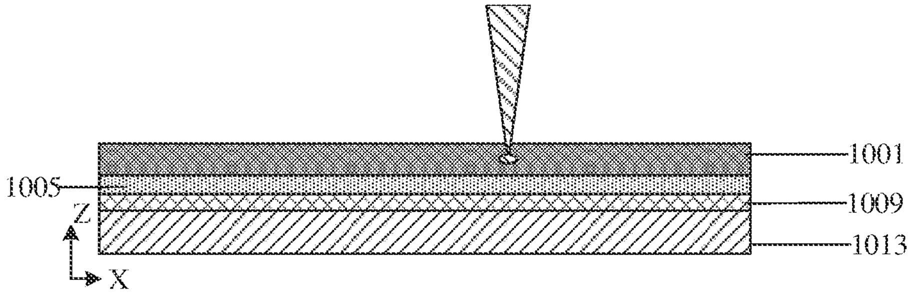

Referring to FIG. 11, at S1002, the first dicing lane is diced. Here, the first dicing lane may be diced from the side of the first wafer 1001 away from the second wafer 1005. It may be understood that, as shown in FIG. 11, the first dicing lane of the first wafer 1001 is diced from the side of the first wafer 1001. It may be understood that, in examples of the present disclosure, the pointing direction of the first mark may be the same as the extending direction of the first dicing lane, and the cleavage plane of the first wafer 1001 may be parallel to the pointing direction of the first mark, such that the cleavage plane of the first wafer 1001 is parallel to the extending direction of the first dicing lane of the first wafer 1001. As such, the dicing may be performed from the side of the first wafer 1001 of the semiconductor structure during the subsequent dicing of the semiconductor structure to be diced, and the first wafer 1001 is more prone to cleave along a direction of the first dicing lane. In this way, the problem of the first peripheral circuit chips cleaving along the interiors of the chips may be reduced, thereby improving the chip yield due to the fact that the cleavage plane of the wafer passes through the interiors of the first peripheral circuit chips when there is a certain included angle between the cleavage plane and the dicing lane of the wafer. In some examples, the dicing the first dicing lane of the first wafer 1001 from the side of the first wafer 1001 away from the second wafer 1005 may include dicing the first dicing lane of the first wafer 1001 from the side of the first wafer 1001 away from the second wafer 1005 by using a laser dicing process.

Figure 12:
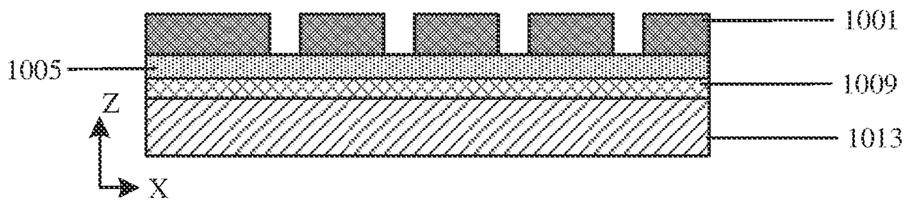

Referring to FIG. 12, at S1003, the semiconductor structure to be diced is stretched, such that the cleavage plane of the first wafer 1001 extends to the second wafer 1005. In some examples, there is a third dicing lane between the plurality of memory array chips of the second wafer 1005, and an extending direction of the third dicing lane is the same as the extending direction of the first dicing lane. After stretching the semiconductor structure to be diced, the cleavage plane of the first wafer 1001 may extend to the second wafer 1005. The cleavage plane of the first wafer 1001 may be parallel to the extending direction of the first dicing lane, and the extending direction of the third dicing lane may be the same as the extending direction of the first dicing lane. Thus, the cleavage plane extending to the second wafer 1005 is parallel to the extending direction of the third dicing lane, such that the second wafer 1005 cleaves along a direction of the third dicing lane, thereby enabling an increase of the dicing yield of the chips.

In some examples, the semiconductor structure may further include a third wafer 1009. The third wafer 1009 may include a plurality of second peripheral circuit chips, a second dicing lane between the second peripheral circuit chips, and a second mark at an edge of the third wafer 1009, and an extending direction of the second dicing lane may be the same as the extending direction of the first dicing lane.

In some examples, an included angle between a pointing direction of the second mark and the extending direction of the second dicing lane may be a, where a is in the range of $0° < a < 90°$. Characteristic sizes of devices in the second peripheral circuit chips may be smaller than characteristic sizes of devices in the first peripheral circuit chips. The pointing direction of the second mark may be an extending direction of a line of symmetry of the third wafer 1009. The stretching the semiconductor structure to be diced such that the cleavage plane of the first wafer 1001 extends to the second wafer 1005 may include stretching the semiconductor structure to be diced such that the cleavage plane of the first wafer 1001 extends to the second wafer 1005 and the third wafer 1009.

It may be understood that, the first wafer 1001 is used as a wafer to be diced, while the third wafer 1009 is mainly used for forming high-performance peripheral circuit devices, such that the yield problem during the dicing of the semiconductor structure can be improved, and the high-performance peripheral circuit devices can also be formed.

In some examples, the pointing direction of the second mark may be the same as the extending direction of the second dicing lane, a cleavage plane of the third wafer 1009 may be parallel to the pointing direction of the second mark, and the characteristic sizes of the devices in the first peripheral circuit chips may be the same as the characteristic sizes of the devices in the second peripheral circuit chips. The pointing direction of the second mark may be the extending direction of the line of symmetry of the third wafer 1009. The second wafer 1005 may be located between the first wafer 1001 and the third wafer 1009.

In some examples, the method may further include dicing the second dicing lane from a side of the third wafer 1009 away from the second wafer 1005 while dicing the first dicing lane from the side of the first wafer 1001 away from the second wafer 1005. In some examples, stretching the semiconductor structure to be diced such that the cleavage plane of the first wafer 1001 extends to the second wafer 1005 may include stretching the semiconductor structure to be diced, such that the cleavage plane of the first wafer 1001 and the cleavage plane of the third wafer 1009 extend to the second wafer 1005.

It may be understood that, when the pointing direction of the second mark is the same as the extending direction of the second dicing lane, and the cleavage plane of the third wafer 1009 is parallel to the pointing direction of the second mark, the cleavage plane of the third wafer 1009 may be parallel to the extending direction of the second dicing lane of the third wafer 1009. As such, the third wafer 1009 may also be suitable for dicing. The second wafer 1005 may be located between the first wafer 1001 and the third wafer 1009 such that the semiconductor structure may be diced from the side of the first wafer 1001 and the side of the third wafer 1009 simultaneously. Then, the semiconductor structure to be diced may be stretched such that the cleavage plane of the first wafer 1001 and the cleavage plane of the third wafer 1009 both extend to the second wafer 1005, thereby separating the second wafer 1005 along the third dicing lane. As such, the process requirement of simultaneous two-side dicing may be met, the dicing efficiency may be improved, and the yield of the chips after the dicing may also be increased.

In some examples, the semiconductor structure to be diced may be diced using a wafer dicing device as following. The wafer dicing device may include a carrier table, a first dicing sub-device and a second dicing sub-device. The carrier table may be configured to carry a wafer to be diced. The first dicing sub-device may be configured to dice the wafer to be diced from a first side. The second dicing sub-device may be configured to dice the wafer to be diced from a second side. The first side and the second side may be two opposite sides of the carrier table along a first direction that is a thickness direction of the carrier table.

It may be understood that the wafer dicing device may include the first dicing sub-device and the second dicing sub-device, which are respectively configured to dice the semiconductor structure to be diced from the two sides of the thickness direction of the carrier table. On one hand, front side and back side dicing of the semiconductor structure to be diced can be achieved simultaneously, which can improve the dicing efficiency. On the other hand, since the front side and the back side of the semiconductor structure to be diced may be diced simultaneously, components of the first dicing sub-device and the second dicing sub-device may be disposed correspondingly. This may improve the problem that front side and back side dicing positions are difficult to align in a process of dicing the front side and the back side of the semiconductor structure to be diced separately, which can further increase the yield of the chips after dicing.

In some examples, the semiconductor structure to be diced may be placed on the carrier table. The semiconductor structure to be diced may be diced from the first side by using the first dicing sub-device, and the semiconductor structure to be diced may be diced from the second side by using the second dicing sub-device. The first side and the second side are two opposite sides of the carrier table along the first direction that is the thickness direction of the carrier table.

In some examples, the pointing direction of the second mark may be the same as the extending direction of the second dicing lane, a cleavage plane of the third wafer 1009 may be parallel to the pointing direction of the second mark, and the characteristic sizes of the devices in the first peripheral circuit chips may be the same as the characteristic sizes of the devices in the second peripheral circuit chips. The pointing direction of the second mark may be the extending direction of the line of symmetry of the third wafer 1009. The third wafer 1009 may be located between the first wafer 1001 and the second wafer 1005.

In some examples, the dicing the first dicing lane from the side of the first wafer 1001 away from the second wafer 1005 may include dicing the first dicing lane and the second dicing lane from the side of the first wafer 1001 away from the second wafer 1005. Stretching the semiconductor structure to be diced such that the cleavage plane of the first wafer 1001 extends to the second wafer 1005 may include stretching the semiconductor structure to be diced, such that the cleavage plane of the first wafer 1001 and the cleavage plane of the third wafer 1009 extend to the second wafer 1005.

It may be understood that, the third wafer 1009 is located between the first wafer 1001 and the second wafer 1005, the cleavage plane of the first wafer 1001 is parallel to the extending direction of the first dicing lane, and the cleavage plane of the third wafer 1009 is parallel to the extending direction of the second dicing lane. Thus, both the first wafer 1001 and the third wafer 1009 may be diced from the side of the first wafer 1001 by using a laser dicing process, and then the semiconductor structure to be diced is stretched, such that both the cleavage plane of the first wafer 1001 and the cleavage plane of the third wafer 1009 extend to the second wafer 1005. In this way, the second wafer 1005 may be separated along the third dicing lane.

In some examples, the stretching the semiconductor structure to be diced may include stretching the semiconductor structure to be diced along a direction perpendicular to the cleavage plane of the first wafer 1001.

In some examples, the stretching may be along an X-axis direction as shown in FIG. 12, but the stretching direction of the semiconductor structure is not limited thereto.

It may be understood that, the positions of the wafer cleavage planes are positions that are prone to fracture, and when the semiconductor structure to be diced is stretched, the wafers are more likely to cleave along the cleavage planes if the stretching is performed along a direction perpendicular to the cleavage plane of the first wafer 1001.

Figure 13:
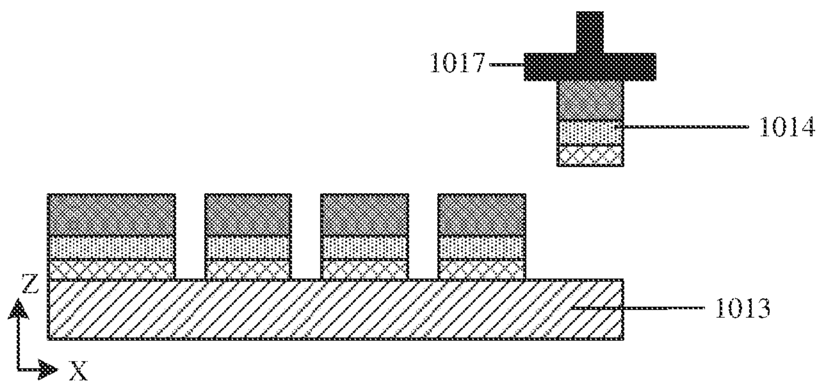

In some examples, as shown in FIG. 13, after the dicing operation is finished for the wafer to be diced, individual memories 1014 may be formed, and the separated memories 1014 can be taken from the carrier wafer 1013 by using a device with a robotic arm 1017.

Based on the above dicing method of the semiconductor structure, examples of the present disclosure further provide a memory, which is obtained by dicing the semiconductor structure by using the dicing method of any one of the above examples.

It is to be understood that, references to "one example" or "an example" throughout this specification mean that particular features, structures, or characteristics related to the example are included in at least one example of the present disclosure. Therefore, "in one example" or "in an example" presented throughout this specification does not necessarily refer to the same example. Furthermore, these particular features, structures, or characteristics may be incorporated in one or more examples in any suitable manner. It is to be understood that, in various examples of the present disclosure, sequence numbers of the above processes do not indicate an execution sequence, and an execution sequence of the processes shall be determined by functionalities and intrinsic logics thereof, and shall constitute no limitation on implementation processes of the examples of the present disclosure. The above sequence numbers of the examples of the present disclosure are only for description, and do not represent advantages or disadvantages of the examples.

The methods disclosed in several method examples as provided by the present disclosure may be combined freely to obtain new method examples in case of no conflicts.

The above descriptions are merely specific implementations of the present disclosure, and the protection scope of the present disclosure is not limited to these. Any variation or replacement that may be readily figured out by those skilled in the art within the technical scope disclosed by the present disclosure shall fall within the protection scope of the present disclosure. Thus, the protection scope of the present disclosure shall be defined by the protection scope of the claims.

What is claimed is:

1. A semiconductor structure, comprising:
a first wafer, comprising:
a plurality of first peripheral circuit chips;
a first dicing lane between the first peripheral circuit chips; and
a first mark at an edge of the first wafer,
wherein a pointing direction of the first mark is the same as an extending direction of the first dicing lane, a cleavage plane of the first wafer is parallel to the pointing direction of the first mark, and the pointing direction of the first mark is an extending direction of a line of symmetry of the first wafer;
a second wafer; and
a third wafer comprising a plurality of second peripheral circuit chips and a second mark at an edge of the third wafer,
wherein:
the third wafer, the second wafer, and the first wafer are disposed in a stack, and the second wafer comprises a plurality of memory array chips, and
an included angle between a pointing direction of the second mark and an extending direction of a second dicing lane, between the second peripheral circuit chips, is α, where 0°<α<90°.

2. The semiconductor structure of claim 1, wherein:
the third wafer further comprises the second dicing lane arranged between the second peripheral circuit chips, and
an extending direction of the second dicing lane is the same as the extending direction of the first dicing lane.

3. The semiconductor structure of claim 2, wherein:
characteristic sizes of devices in the second peripheral circuit chips are smaller than characteristic sizes of devices in the first peripheral circuit chips, and
the pointing direction of the second mark is an extending direction of a line of symmetry of the third wafer.

4. The semiconductor structure of claim 2, wherein:
the pointing direction of the second mark is an extending direction of a line of symmetry of the third wafer.

5. The semiconductor structure of claim 2, wherein the third wafer is located between the first wafer and the second wafer.

6. The semiconductor structure of claim 2, wherein the second wafer is located between the first wafer and the third wafer.

7. The semiconductor structure of claim 1, wherein the memory array chips comprise three-dimensional NAND memory array chips.

8. A method of dicing a semiconductor structure, comprising:
providing a semiconductor structure to be diced,
wherein the semiconductor structure to be diced comprises a first wafer, a second wafer, and a third wafer,
wherein the first wafer comprises a plurality of first peripheral circuit chips, a first dicing lane between the first peripheral circuit chips, and a first mark at an edge of the first wafer, a pointing direction of the first mark is the same as an extending direction of the first dicing lane, and a cleavage plane of the first wafer is parallel to the pointing direction of the first mark,
wherein the second wafer and the first wafer are disposed in a stack, and the second wafer comprises a plurality of memory array chips,
wherein the pointing direction of the first mark is an extending direction of a line of symmetry of the first wafer, and
wherein the third wafer comprises a plurality of second peripheral circuit chips and a second mark at an edge of the third wafer, an included angle between a pointing direction of the second mark and an extending direction of a second dicing lane, between the second peripheral circuit chips, being α, where 0°<α<90°;
dicing the first dicing lane from a side of the first wafer away from the second wafer; and
stretching the semiconductor structure to be diced, such that the cleavage plane of the first wafer extends to the second wafer.

9. The method of claim 8, wherein dicing the first dicing lane of the first wafer from the side of the first wafer away from the second wafer comprises:
dicing the first dicing lane of the first wafer from the side of the first wafer away from the second wafer by using a laser dicing process.

10. The method of claim 8, wherein;
the third wafer comprises the second dicing lane arranged between the second peripheral circuit chips, and
an extending direction of the second dicing lane is the same as the extending direction of the first dicing lane.

11. The method of claim 10, wherein:
characteristic sizes of devices in the second peripheral circuit chips are smaller than characteristic sizes of devices in the first peripheral circuit chips,
the pointing direction of the second mark is an extending direction of a line of symmetry of the third wafer, and
stretching the semiconductor structure to be diced such that the cleavage plane of the first wafer extends to the second wafer comprises:
stretching the semiconductor structure to be diced such that the cleavage plane of the first wafer extends to the second wafer and the third wafer.

12. The method of claim 10, wherein:
the pointing direction of the second mark is an extending direction of a line of symmetry of the third wafer,
the second wafer is located between the first wafer and the third wafer, and
the method further comprises:
dicing the second dicing lane from a side of the third wafer away from the second wafer while dicing the first dicing lane from the side of the first wafer away from the second wafer.

13. The method of claim 10, wherein:
the pointing direction of the second mark is an extending direction of a line of symmetry of the third wafer.

14. The method of claim 8, wherein stretching the semiconductor structure to be diced comprises:
stretching the semiconductor structure to be diced along a direction perpendicular to the cleavage plane of the first wafer.

15. The method of claim 8, wherein providing the semiconductor structure to be diced comprises:
providing the first wafer comprising the plurality of first peripheral circuit chips;
providing the second wafer comprising the plurality of memory array chips; and
bonding the first wafer to the second wafer to form the semiconductor structure to be diced.

16. A method of forming a memory, comprising:
providing a semiconductor structure to be diced, wherein the semiconductor structure to be diced comprises a first wafer, a second wafer, and a third wafer, wherein the first wafer comprises a plurality of first peripheral circuit chips, a first dicing lane between the first peripheral circuit chips, and a first mark at an edge of the first wafer, a pointing direction of the first mark is the same as an extending direction of the first dicing lane, and a cleavage plane of the first wafer is parallel to the pointing direction of the first mark, wherein the second wafer and the first wafer are disposed in a stack, and the second wafer comprises a plurality of memory array chips, wherein the pointing direction of the first mark is an extending direction of a line of symmetry of the first wafer, and wherein the third wafer comprises a plurality of second peripheral circuit chips and a second mark at an edge of the third wafer, the second mark indicating a direction along a line of symmetry of the third wafer, and the line of symmetry of the third wafer being non-collinear with the line of symmetry of the first wafer;

dicing the first dicing lane from a side of the first wafer away from the second wafer; and stretching the semiconductor structure to be diced, such that the cleavage plane of the first wafer extends to the second wafer.

17. The method of claim 16, wherein dicing the first dicing lane of the first wafer from the side of the first wafer away from the second wafer comprises:

dicing the first dicing lane of the first wafer from the side of the first wafer away from the second wafer by using a laser dicing process.

18. The method of claim 16, wherein:

the third wafer comprises a second dicing lane arranged between the second peripheral circuit chips, and an extending direction of the second dicing lane is the same as the extending direction of the first dicing lane.

19. The method of claim 18, wherein:

an included angle between a pointing direction of the second mark and the extending direction of the second dicing lane is a, $0° < a < 90°$, and characteristic sizes of devices in the second peripheral circuit chips are smaller than characteristic sizes of devices in the first peripheral circuit chips, the pointing direction of the second mark is an extending direction of the line of symmetry of the third wafer, and stretching the semiconductor structure to be diced such that the cleavage plane of the first wafer extends to the second wafer comprises:

stretching the semiconductor structure to be diced such that the cleavage plane of the first wafer extends to the second wafer and the third wafer.

20. The method of claim 18, wherein:

the pointing direction of the second mark is an extending direction of the line of symmetry of the third wafer.

* * * * *